United States Patent
De Silva et al.

(10) Patent No.: US 11,121,024 B2
(45) Date of Patent: Sep. 14, 2021

(54) TUNABLE HARDMASK FOR OVERLAYER METROLOGY CONTRAST

(71) Applicant: International Business Machines Corporation, Armonk, NY (US)

(72) Inventors: Ekmini A. De Silva, Slingerlands, NY (US); Nelson Felix, Slingerlands, NY (US); Indira Seshadri, Niskayuna, NY (US); Stuart A. Sieg, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 108 days.

(21) Appl. No.: 16/542,502

(22) Filed: Aug. 16, 2019

(65) Prior Publication Data
US 2019/0371651 A1    Dec. 5, 2019

Related U.S. Application Data

(63) Continuation of application No. 15/861,774, filed on Jan. 4, 2018, now Pat. No. 10,622,248.

(51) Int. Cl.
*H01L 21/762* (2006.01)
*H01L 23/544* (2006.01)
(Continued)

(52) U.S. Cl.
CPC .... *H01L 21/76294* (2013.01); *H01L 21/0272* (2013.01); *H01L 21/4885* (2013.01);
(Continued)

(58) Field of Classification Search
CPC ........... H01L 21/3086; H01L 29/66795; H01L 21/0337; H01L 21/3081; H01L 21/823431; H01L 29/785; H01L 21/31144; H01L 21/0332; H01L 29/66545; H01L 21/32139; H01L 21/845; H01L 29/6653; H01L 2924/0002; H01L 21/0274; H01L 23/544; H01L 27/1211; H01L 29/66666; H01L 29/7846; H01L 21/0276; H01L 21/30604; H01L 21/31111; H01L 21/31051; H01L 21/76816; H01L 21/823481; H01L 23/528;
(Continued)

(56) References Cited

U.S. PATENT DOCUMENTS 6,392,280 B1    5/2002   Besser et al.
6,533,907 B2    3/2003   Demaray et al.
(Continued)

OTHER PUBLICATIONS

C. C. Tsai et al., "Film formation mechanisms in the plasma deposition of hydrogenated amorphous silicon," Journal of Applied Physics, vol. 59, No. 8, 1986, pp. 2998-3001.
(Continued)

*Primary Examiner* — Robert G Bachner
(74) *Attorney, Agent, or Firm* — Cantor Colburn LLP; Abdy Raissinia

(57) ABSTRACT

A tunable amorphous silicon layer for use with multilayer patterning stacks can be used to maximize transparency and minimize reflections so as to improve overlay metrology contrast. By increasing the hydrogen content in the amorphous silicon layer, the extinction coefficient (k) value and the refractive index (n) value can be decreased to desired values. Methods for improving overlay metrology contrast with the tunable amorphous silicon layer are disclosed.

20 Claims, 2 Drawing Sheets

(51) Int. Cl.
*H01L 21/027* (2006.01)
*H01L 21/768* (2006.01)
*H01L 21/48* (2006.01)
*B82Y 40/00* (2011.01)

(52) U.S. Cl.
CPC .......... *H01L 21/768* (2013.01); *H01L 23/544* (2013.01); *B82Y 40/00* (2013.01); *H01L 2223/54426* (2013.01)

(58) Field of Classification Search
CPC ............. H01L 27/0886; H01L 29/0649; H01L 29/161; H01L 29/6681; H01L 21/02532; H01L 2223/54426; H01L 2223/54453; H01L 2924/00; H01L 29/0657; H01L 21/02592; H01L 2223/5442; H01L 27/0924; H01L 29/165; H01L 29/6656; H01L 29/7827; H01L 21/02186; H01L 21/0338; H01L 21/26506; H01L 21/28123; H01L 21/3088; H01L 21/31122; H01L 21/32137; H01L 21/76213; H01L 21/76877; H01L 21/76897; H01L 21/823412; H01L 21/823821; H01L 29/0653; H01L 29/16; H01L 29/66553; H01L 29/7848; H01L 29/7851; H01L 21/76224; H01L 21/76865; H01L 21/823807; H01L 21/823864; H01L 29/42356; H01L 29/7842; H01L 29/7845; H01L 21/3065; H01L 21/308; H01L 21/31; H01L 21/76802; H01L 21/76843; H01L 21/823878; H01L 2224/0362; H01L 2224/11622; H01L 23/5226; H01L 29/78642; H01L 45/1675; H01L 51/0018; H01L 21/02266; H01L 21/0228; H01L 21/0273; H01L 21/0335; H01L 21/30608; H01L 21/3085; H01L 21/31116; H01L 21/31138; H01L 21/32134; H01L 21/76892; H01L 27/0207; H01L 27/088; H01L 21/02175; H01L 21/02183; H01L 21/0234; H01L 21/0262; H01L 21/321; H01L 21/76804; H01L 21/76829; H01L 21/76895; H01L 21/823842; H01L 21/8258; H01L 22/12; H01L 23/535; H01L 27/092; H01L 29/04; H01L 29/0847; H01L 29/1033; H01L 29/167; H01L 29/42372; H01L 29/42384; H01L 29/66742; H01L 29/7856; H01L 29/78696; H01L 21/02123; H01L 21/02164; H01L 21/02167; H01L 21/0217; H01L 21/02181; H01L 21/02189; H01L 21/02274; H01L 21/02356; H01L 21/28088; H01L 21/28185; H01L 21/32055; H01L 21/76819; H01L 21/76826; H01L 21/76837; H01L 21/823468; H01L 21/823487; H01L 21/823828; H01L 21/823857; H01L 21/823885; H01L 21/823892; H01L 2223/54406; H01L 2223/54413; H01L 2223/54433; H01L 2223/54493; H01L 22/14; H01L 22/30; H01L 23/53228; H01L 27/0922; H01L 27/0928; H01L 29/0673; H01L 29/1037; H01L 29/1054; H01L 29/42392; H01L 29/517; H01L 29/7849; H01L 29/7853; G03F 7/70633; G03F 7/70683; G03F 7/094; G03F 9/708; G03F 7/11; G03F 7/091; G03F 7/165; G03F 7/168; G03F 7/2004; G03F 7/2037; G03F 7/0392; G03F 7/423; G03F 1/74; G03F 7/0045; G03F 7/027; G03F 7/0382; G03F 7/16; G03F 7/325; G03F 7/40; G03F 7/028; G03F 7/038; G03F 7/0755; G03F 7/162; G03F 9/7076; G03F 9/7084; Y10S 438/947; Y10S 438/95; B82Y 30/00; B82Y 40/00; C07C 2603/18; C07C 309/66; C07C 43/215; C07C 43/225; C07C 69/54; C07C 303/30; C07C 41/22; C07C 41/24; C07C 43/23; C07C 57/50; C07C 67/14

See application file for complete search history.

(56) References Cited

U.S. PATENT DOCUMENTS

| | | | |
|---|---|---|---|
| 8,148,232 | B2 | 4/2012 | Chen et al. |
| 8,659,029 | B2 | 2/2014 | Wang et al. |
| 8,822,343 | B2 | 9/2014 | Hsieh et al. |
| 9,224,661 | B2 | 12/2015 | Strocchia-Rivera |
| 9,330,985 | B2 | 5/2016 | Vaid et al. |
| 9,490,217 | B1 | 11/2016 | Lin et al. |
| 2007/0057261 | A1 | 3/2007 | Jeong et al. |
| 2010/0052191 | A1 | 3/2010 | Trogisch et al. |
| 2014/0104690 | A1 | 4/2014 | Chardonnal |
| 2019/0206722 | A1 | 7/2019 | De Silva |

OTHER PUBLICATIONS

List of IBM Patents or Patent Applications Treated as Related; (Appendix P), Date Filed Aug. 16, 2019; 2 pages.

R. M. Silver et al., "Improving optical measurement accuracy using multi-technique nested uncertainties," Proc. of SPIE, vol. 7272, 727202, 2009, 14 pages.

Y-S. Hwang et al., "Improvement of alignment and overlay accuracy on amorphous carbon layers," Proc. SPIE., vol. 6152, 615222, 2006, 8 pages.

| H₂ FLOW (MOLAR %) | n | k |
|---|---|---|
| 0 | 4.1 | 0.4 |
| 5 | 3.7 | 0.2 |
| 10 | 3.5 | 0.09 |
| 15 | 3.4 | 0.05 |
| 20 | 3.3 | 0.04 |
| 25 | 3.2 | 0.03 |

TUNABLE HARDMASK FOR OVERLAYER METROLOGY CONTRAST

DOMESTIC PRIORITY

This application is a continuation of U.S. application Ser. No. 15/861,774, titled "TUNABLE HARDMASK FOR OVERLAYER METROLOGY CONTRAST" filed Jan. 4, 2018, the contents of which are incorporated by reference herein in its entirety.

BACKGROUND

The present invention generally relates to fabrication methods and resulting structures for semiconductor devices. More specifically, the present invention relates to methods for improving overlay metrology contrast for aligning patterned features in different layers of a semiconductor device.

Semiconductor devices and integrated circuits are generally formed of multiple layers including patterned features. Overlay accuracy generally pertains to the determination of how accurately a first patterned layer aligns with respect to a second patterned layer disposed in the same layer, above the same layer, or below the same layer. Proper alignment of different layers is essential for proper performance of the fabricated semiconductor devices and circuits. For advanced design rules, overlay accuracy becomes even more difficult and important given the critical dimensions of the various features. Poor overlay signal due to the increases in the stack thicknesses needed for multilayer lithography currently used at the 10 nm and 7 nm technology nodes can have a tremendous impact on overlay error.

SUMMARY

Embodiments of the present invention are generally directed to semiconductor structures and methods for forming the semiconductor structures. A non-limiting example method of improving overlay metrology contrast according to embodiments of the invention includes forming at least one alignment feature in a dielectric oxide layer and removing a portion of the dielectric oxide layer. An amorphous silicon layer is deposited in the removed portion of the dielectric oxide layer, wherein the amorphous silicon layer has an extinction coefficient (k) of less than about 0.4 at a wavelength of 633 nm. A multilayer patterning stack is deposited overlaying the amorphous silicon layer, wherein the transmission of visible light from the multilayer patterning stack to the alignment feature is increased relative to not removing the portion of the dielectric oxide layer and depositing the amorphous silicon layer.

A non-limiting example method of improving overlay metrology contrast according to one or more other embodiments of the invention includes forming at least one alignment feature in a dielectric oxide layer. An amorphous silicon layer is deposited on the dielectric oxide layer, wherein the amorphous silicon layer is tuned to minimize reflection and maximize transmission by providing an extinction coefficient (k) of less than 0.4 and a refractive index (n) less than about 4.1 at a wavelength of 633 nm. A multilayer patterning stack is deposited on the tuned amorphous silicon layer, wherein the transmission of visible light from the multilayer patterning stack to the alignment feature is increased relative to not depositing the amorphous silicon layer.

A non-limiting example method of improving overlay metrology contrast according to one or more other embodiments of the invention includes depositing an amorphous silicon layer under a multilayer patterning stack, wherein depositing the amorphous silicon layer includes adjusting a hydrogen content in the amorphous silicon layer to reduce an extinction coefficient (k) value to less than 0.4 and a refractive index (n) to less than 4.1. at a wavelength of 633 nm.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figures 1, 2:
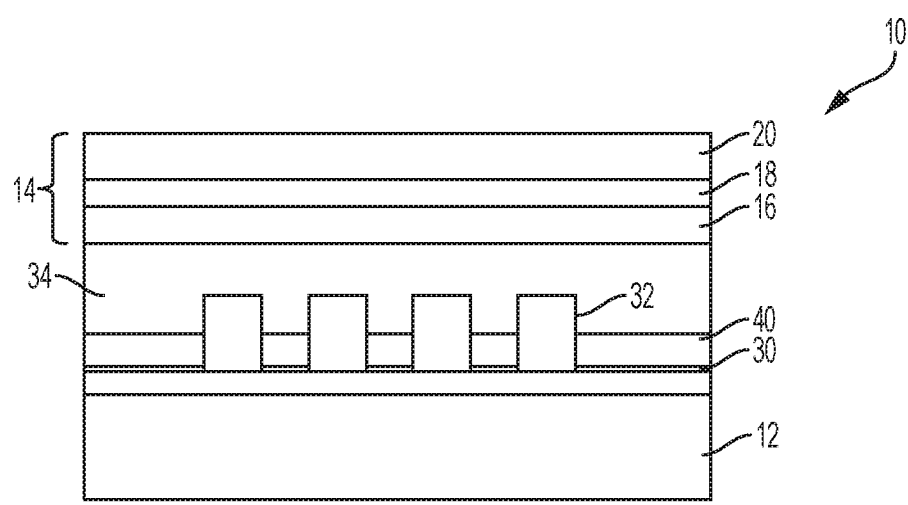
FIG. 1 is a table detailing extinction coefficient (k) values and the refractive index (n) values at a wavelength of 633 nm as a function of the molar percentages of hydrogen gas in a silane gas mixture in a vapor deposition process for forming an amorphous silicon layer according to one or more embodiments of the invention.
FIG. 2 depicts a cross sectional view of an exemplary semiconductor structure at an intermediate stage of manufacturing according to one or more embodiments of the invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

As noted above, poor overlay signal due to the increases in the stack thicknesses used in the multilayer patterning lithographic stack for advanced design rules at the 10 nm and 7 nm technology nodes can result in poor alignment of a first pattern relative to a second pattern disposed on the same layer, above the same layer, or below the same layer. The present invention overcomes these problems by providing a tunable amorphous silicon layer below the multilayer patterning stack, wherein the tunable amorphous silicon layer can be tuned to provide a substantially transparent layer with minimal reflections that can be used to markedly improve the metrology contrast. The tunable amorphous silicon layer can be used to replace an underlying dielectric layer or can be added to a hardmask layer to minimize the thickness of the existing underlying hardmask layers as to provide greater visibility to the alignment features, thereby improving overlay metrology contrast.

By way of example, titanium nitride (TiN) is a material that is often utilized as a hardmask and provides high etch selectivity to materials such as photoresist materials, organic planarization materials, and dielectric materials such as silicon nitride (SiN), silicon dioxide ($SiO_2$) low-k dielectric materials, and the like. As such, these materials can be etched selective to TiN. However, TiN has a high extinction coefficient k value (also referred to as the absorption coefficient) and is not an anti-reflective material. The value of the extinction coefficient k value of TiN is in a range from 0.9 to 3.8 in the visible wavelength range. This relatively high extinction coefficient of TiN poses a significant problem for the purpose of overlay alignment as a k value greater than 1.0 is generally considered opaque. In a lithographic stack in which a TiN layer is employed as a hard mask layer, if the TiN layer is too thick, an overlay signal for the purpose of alignment from underlying lithographic alignment mark is too weak, and lithographic alignment cannot be performed reliably. If the TiN layer in a lithographic stack is too thin, the fidelity of the image memorized into the TiN layer for the purpose of dual image transfer can be degraded, and the shape of the pattern memorized in the TiN layer can be distorted. The proposed tunable amorphous silicon overcomes these problems as this material can be tuned to provide an extinction coefficient k value is substantially transparent and a refractive index (n) that minimizes reflections, thereby maximizing light transmission below the multilayer patterning stack to the underlying alignment feature. In view of the foregoing, structures and methods for increasing reference layer metrology contrast are provided that generally includes using the tunable amorphous silicon material below the multilayer patterning stack, e.g., quad layer, trilayer or the like, to increase overlay metrology contrast. By way of example, the multilayer patterning stack can include an organic planarizing layer, a silicon- or metal-oxide hardmask layer, an optional antireflective coating and/or adhesive layer, and a photosensitive resist layer. The tunable amorphous silicon layer provided underneath the multilayer patterning stack can be added on top of an existing dielectric hardmask so as to minimize reflections by tuning the refractive index to a desired refractive index or can be used to replace all or a portion of a dielectric hardmask to maximize transmission by tuning reducing the extinction coefficient (k) so as to enhance optical contrast. As will be described in greater detail herein, the amorphous silicon hardmask can be tuned by varying the hydrogen content thereof so as to enable an extinction coefficient (k) value ranging from about 0.4 to about 0.03, which can translate to an improvement in overlay metrology contrast of about 25 to about 50%. Likewise, controlling the hydrogen content within the amorphous silicon layer can tune the refractive index from about 4.1 to about 3.2, wherein increasing amounts of hydrogen in the amorphous silicon results in lower extinction coefficient (k) and refractive index (n) values. The reduction in refractive index is advantageous because at any interface between two material layers, reflections can occur because of differences in their refractive indices (n) and absorption coefficients (k). In the present invention, by tuning both the refractive indices (n) and the absorption coefficients (k) of the deposited amorphous silicon, it is possible to minimize reflection and maximize transmission into the amorphous silicon layer.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

Patterning techniques employing the multilayer patterning stack can include double patterning techniques such as, for example, a lithographic-etch sequence (LELE or LELELE). Alternative double patterning techniques can include sidewall image transfer process or self-aligned double patterning techniques.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

In one or more embodiments of the invention, the present invention generally includes utilizing the tuned amorphous silicon below the multilayer patterning stack to improve overlay metrology contrast. By replacing all or a portion of an underlying hard mask layer such as SiN and/or $SiO_2$ or replacing all or a portion of an underlying oxide interlayer that are commonly used to during formation of a patterned feature level below the multilayer patterning stack, optical contrast is enhanced by lowering the extinction coefficient k value. Moreover, as noted above, tuning the amorphous silicon to lower the extinction coefficient k value also lowers the refractive index (n).

As is known in the art, deposition of amorphous silicon generally includes a vapor deposition process such as chemical vapor deposition, plasma vapor deposition, or plasma enhanced chemical vapor deposition from a silane gas at an elevated temperature within a range of about 30° C. to about 600° C. and a pressure within a range of about 0.1 Torr to about 10 Torr. Tuning of the amorphous silicon by varying the hydrogen content therein can be effected during or after deposition thereof. In one or more embodiments of the invention, hydrogen gas can be added to the silane gas to increase the percentage of hydrogen in the amorphous silicon, which as noted above can be used to vary the extinction coefficient (k) and refractive index (n) values of the resulting amorphous silicon. Optionally, the amorphous silicon can also be deposited by a sputtering process using a silicon source to provide a hydrogen free amorphous silicon. In one or more embodiments of the invention, the hydrogen content in the amorphous silicon can be effected subsequent to deposition.

By way of example, FIG. 1 is a table detailing extinction coefficient (k) values and refractive index (n) values at a wavelength of 633 nm of amorphous silicon as deposited from silane gas, wherein the hydrogen content is varied by molar percentage (mol %) of hydrogen gas utilized with the silane gas during formation of the amorphous silicon. The amorphous silicon was formed using a PECVD or PVD. As shown, increasing the amounts of hydrogen gas during formation of amorphous silicon from the silane gas decreased the extinction coefficient (k) value at a wavelength of 633 nm from about 0.4 for 0% added hydrogen gas to 0.03 for 25 mol % added hydrogen gas. Additionally, the refractive index (n) of the deposited amorphous silicon decreased from 4.1 for 0% hydrogen gas to about 3.2 for 25 mol % hydrogen gas. In addition to the reduced k value at the 10 mol % hydrogen gas loading, the refractive index was about 3.5, which advantageously reduces reflections between layers and maximizes transmission of light to/from the alignment markers.

Referring now to FIG. 2, there is shown a cross sectional view of an exemplary semiconductor structure 10 at an intermediate stage of manufacturing for advanced design rules subsequent to deposition of a multilayer lithographic patterning stack 14 on a substrate 12. The particular multilayer lithographic stack shown is a trilayer stack but can be a quad layer stack, variations thereof, or the like. As will be readily apparent to those skilled in the art, the present multilayer lithographic structures and processes for lithographic patterning are applicable to a variety of technologies, e.g., NMOS, PMOS, CMOS, etc., and is readily applicable to a variety of devices, including, but not limited to, ASIC's, logic devices, memory devices, and the like.

The substrate 12 can include any semiconducting material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) as well as bulk semiconductor substrates are also contemplated herein. Typically, the semiconductor substrate is a Si-containing semiconductor such as, for example, Si, SiC, SiGe, SiGeC, or a silicon-on-insulator. The substrate can be unstrained, strained or include regions of strain and unstrain therein. The substrate can be intrinsic or it can be doped with, for example, but not limited to boron, arsenic or phosphorous.

When SOI substrates are employed, those substrates include a top semiconductor layer and a bottom semiconductor layer that are separated at least in part by a buried insulating layer. The buried insulating layer includes, for example, a crystalline or non-crystalline oxide, nitride or any combination thereof. In one or more embodiments, the buried insulating layer is an oxide. Typically, the buried insulating layer is formed during initial stages of a layer transfer process or during an ion implantation and annealing process, such as, for example, SIMOX (separation by ion implantation of oxygen).

The trilayer stack 14 of the present disclosure can be used as a block mask for lithographic patterning. Specifically, the trilayer stack 14 includes, from bottom to top, an organic planarization layer (OPL) 16, a hardmask layer 18, and a photoresist layer 20.

The OPL 16 can include any organic material that allows a fast reactive ion etch (RIE) process to reduce RIE damage to underlying layers, such as, for example, a silicon substrate. Examples of organic materials that can be employed as the OPL 16 include, but are not limited to, spin-on carbon (SOC), diamond-like carbon, polyarylene ether, and polyimide. The OPL 16 can be formed utilizing any conventional deposition process including, for example, chemical vapor deposition (CVD), plasma enhanced chemical vapor deposition (PECVD), evaporation, spin coating and dip coating. Chemical mechanical planarization (CMP) and/or grinding can be used to planarize the deposited OPL 16. In one or more embodiments, the planarization layer 30 is a polymer with sufficiently low viscosity so that the top surface of the applied polymer forms a planar top surface. In one or more other embodiments of the invention, the organic planarizing layer is a layer of material capable of being planarized by known chemical mechanical planarization processes. The thickness of the OPL 16 can vary depending on the material as well as the deposition technique used in forming the OPL 16. By way of non-limiting example, the OPL 16 can have a thickness ranging from about 50 nanometers (nm) to about 500 nm, with a thickness from 150 nm to 300 nm being more typical.

The hardmask layer 18 can include, for example, any Si-containing or metal containing material including, but not limited to, titanium, zirconium, and hafnium, that is soluble in a mild chemical etchant, such as, for example, a SC1 solution (a mixture of deionized water, ammonium hydroxide and hydrogen peroxide) that is employed in a subsequent wet chemical clean process. For example, the hardmask layer can be a titanium-containing antireflective coating (TiARC) or a silicon-containing antireflective coating (SiARC). These materials also possess a high etch resistance to the RIE process for etching the OPL 16. The hardmask layer 18 can be formed by spin coating, spray coating, dip coating, PECVD or sputtering. The hardmask layer 18 that is formed can have a thickness from 5 nm to 100 nm, with a thickness from 10 nm to 20 nm being more typical.

The photoresist layer 20 that can be employed in the present disclosure The photoresist layer 20 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons. As such, the photoresist includes any conventional organic photoresist material, such as, for example, methacrylates and polyesters. The photoresist layer 20 can be formed utilizing any conventional deposition process including, but are not limited to, CVD, PECVD, evaporation, spin coating and dip coating. The photoresist layer 20 can have a thickness from 30 nm to 500 nm, with a thickness from 100 nm to 200 nm being more typical.

Employing a combination of an OPL 16 having a high etch rate that requires less RIE etch time and a hardmask layer 18 that can be removed in a mild chemical etchant solution can significantly minimize damage to the substrate or any device structure covered thereby during the lithographic patterning processes. In addition, the high etch resistance of the hardmask layer 18 to the RIE of the OPL 16 prevents the erosion when used as a block mask during the RIE process, thus providing a better edge placement for lithographic lines. The high etch resistance of the hardmask layer 18 also allows use of a relatively thin layer in the trilayer stack 14 so as to reduce an overall thickness of the trilayer stack 14. As a result, a better focus and exposure process window can be achieved for the lithographic patterning processes.

The exemplary semiconductor structure 10 at the intermediate stage of manufacturing can include various layers formed on the substrate 12 in addition to the multilayer patterning stack 14. For example, the various layers can include any dielectric materials suitable for BEOL or MOL interconnect structures (not shown). In one or more embodiments, the various layers can include any gate materials suitable for FEOL structures (not shown). In other embodiments, the various layers can include can be a semiconductor material or a dielectric material on top of a semiconductor material (not shown). Various other layers include, but are not limited to, shallow trench isolation (STI) structures as known in the art, a contact-level dielectric material layer that embeds contact via structures (not shown), and/or metal interconnect level dielectric layers that embed metal via structures (not shown) and metal lines (not shown) as known in the art. The various layers are not intended to be limited to any particular number or type and will generally depend on the devices being manufactured.

In one or more embodiments, a dielectric oxide layer 40 immediately underlies the multilayer patterning stack. The dielectric oxide layer 40 can be formed on a dielectric etch stop layer 30 and includes at least one alignment mark 32 defined by an optically opaque material lithographically formed on the dielectric etch stop layer 30. As used herein, a material is generally considered "optically opaque" if the extinction coefficient k at the wavelength of 633 nm is not less than 1.0. As used herein, a material is "optically transparent" if the extinction coefficient k at the wavelength of 633 nm is less than 1.0. In the present invention, the amorphous silicon layer The dielectric etch stop layer 30 includes a dielectric material that is different from the optically opaque material defining the alignment marks 32. The dielectric material of the dielectric etch stop layer 30 is selected such that an etch process that patterns the optically opaque material is selective to the dielectric etch stop layer 30, i.e., does not etch the dielectric material of the dielectric etch stop layer 30. The dielectric etch stop layer 30 can be, for example, silicon oxynitrides (SiON), carbon containing silicon materials, silicon oxycarbides (SiOC), silicon carbides, silicon nitrides (SiN), carbon containing silicon nitride materials (SiCN), silicon oxide ($SiO_2$), tetra-ethyl-ortho-silicate (TEOS) based oxide, and combinations thereof, and the like.

In one or more embodiments, the optically opaque material defining the alignment mark(s) 32 can be a metal nitride. For example, the metal nitride can be titanium nitride (TiN), tantalum nitride (TaN), or tungsten nitride (WN). A layer of the optically opaque material can be deposited, for example, by physical vapor deposition (PVD) and subsequently patterned to form the alignment mark(s) 32.

In the present invention, an upper portion of the dielectric oxide layer 40 is removed and replaced with a tuned amorphous silicon 34 having an extinction coefficient k value at a wavelength of 633 nm of less than about 0.4 as described above, which increases transparency for metrology purposes. The particular extinction coefficient (k) and the refractive index (n) values can be further tuned to provide the desired values by varying the hydrogen content therein. As a result, the visibility of the alignment marks is substantially increased and overlay alignment is significantly improved. The dielectric oxide layer 40 can function as a sacrificial layer and be removed during subsequent processing to form the semiconductor structure.

Figure 3:
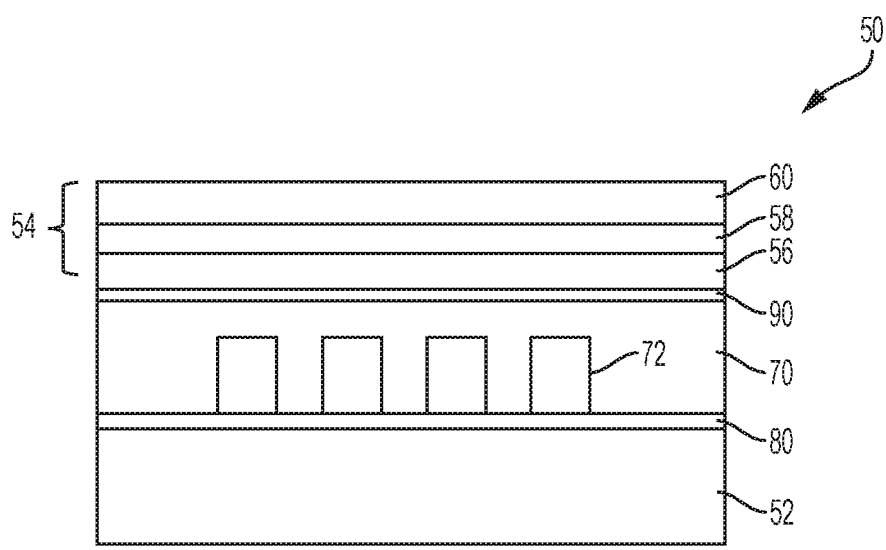
FIG. 3 depicts a cross sectional view of an exemplary semiconductor structure at an intermediate stage of manufacturing according to one or more embodiments of the invention.

Turning now to FIG. 3, there is depicted a cross sectional view of an exemplary semiconductor structure 50 at an intermediate stage of manufacturing for advanced design rules subsequent to deposition of a multilayer lithographic stack 54 on a substrate 52 in accordance with one or more embodiments of the invention. The particular multilayer lithographic stack shown is a trilayer stack but can be a quad layer stack, variations thereof, or the like.

As described above, the multilayer patterning stack 54 can be used as a block mask for lithographic patterning. Using as a trilayer stack as an exemplary multilayer patterning stack 54, the trilayer stack includes, from bottom to top, an OPL 56, a hardmask layer 58, and a photoresist layer 60 similar to that previously described.

The semiconductor structure further includes a dielectric oxide layer 70 underlying the multilayer patterning stack. The dielectric oxide layer 70 can be formed on a dielectric etch stop layer 80 and includes at least one alignment mark 72 defined by an optically opaque material formed on the dielectric etch stop layer 70. A relatively thin layer of tuned amorphous silicon 90 having a k value less than 1.0 at a wavelength of 633 nm can be provided between the oxide layer 70 and the multilayer patterning stack 54. The tuned amorphous silicon layer 90 can be provided in embodiments where it is not practical to tune the dielectric layer 70 as described above. Tuning the amorphous silicon layer can provide a decreased refractive index that minimizes reflection and improves metrology contrast. The thickness of the tuned amorphous silicon layer can be from about 5 nm to about 10 nm.

Advantageously, incorporating the tuned amorphous silicon underneath the multilayer patterning stack can provide superior overlay performance in lithographic processes by minimizing reflections and maximizing transparency.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises", "comprising", "includes", "including", "has", "having", "contains" or "containing", or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of improving overlay metrology contrast, the method comprising:
    forming at least one alignment feature in a dielectric oxide layer;
    removing a portion of the dielectric oxide layer;
    depositing, in a deposition chamber, an amorphous silicon layer on the dielectric oxide layer corresponding to the removed portion;
    varying hydrogen content in the deposition chamber such that the amorphous silicon layer comprises hydrogen; and
    depositing a multilayer patterning stack overlaying the amorphous silicon layer, wherein transmission of visible light from the multilayer patterning stack to the alignment feature is increased relative to not removing the portion of the dielectric oxide layer and depositing the amorphous silicon layer.

2. The method of claim 1, wherein the amorphous silicon has an extinction coefficient (k) within a range of 0.4 to 0.03 at a wavelength of 633 nm and a refractive index (n) within a range of 4.1 to 3.2.

3. The method of claim 1, wherein the amorphous silicon has an extinction coefficient (k) within a range of 0.09 to 0.03 at a wavelength of 633 nm and a refractive index (n) within a range of 3.5 to 3.2.

4. The method of claim 1, wherein depositing the amorphous silicon layer comprises a vapor deposition process from a gas mixture comprising silane and hydrogen gas at a temperature within a range of about 30° C. to about 600° C. and a pressure within a range of about 0.1 Torr to about 10 Torr.

5. The method of claim 4, wherein the hydrogen gas is greater than 10 mol % of the gas mixture and further reduces the extinction coefficient k value within a range from about 0.09 to about 0.03 and the refractive index value within a range of about 3.5 to about 3.2.

6. The method of claim 1, wherein the amorphous silicon has an extinction coefficient (k) within a range of about 0.09 to about 0.03 at a wavelength of 633 nm.

7. The method of claim 1, wherein depositing the amorphous silicon layer in the removed portion of the dielectric oxide layer comprises varying a hydrogen content in the amorphous silicon to reduce an extinction coefficient (k) at a wavelength of 633 nm and a refractive index (n) of the amorphous silicon.

8. The method of claim 1, wherein depositing the amorphous silicon layer comprises a vapor deposition process from a gas mixture comprising silane at a temperature within a range of about 30° C. to about 600° C. and a pressure within a range of about 0.1 Torr to about 10 Torr to form the amorphous silicon layer; and doping the amorphous silicon layer with hydrogen to reduce the extinction coefficient (k) of the amorphous silicon within a range of about 0.4 to about 0.03 at a wavelength of 633 nm.

9. The method of claim 1, wherein the multilayer patterning stack comprises an organic planarizing layer, a hardmask on the organic planarizing layer, and a photoresist on the hardmask layer.

10. A method of improving overlay metrology contrast, the method comprising:
    forming at least one alignment feature in a dielectric oxide layer;
    depositing an amorphous silicon layer on the dielectric oxide layer, wherein the depositing of the amorphous silicon layer comprises varying hydrogen content in a deposition chamber such that the amorphous silicon layer comprises hydrogen and is tuned to minimize reflection and maximize transmission; and depositing a multilayer patterning stack on the tuned amorphous silicon layer, wherein the transmission of visible light from the multilayer patterning stack to the alignment feature is increased relative to not depositing the amorphous silicon layer.

11. The method of claim 10, depositing an amorphous silicon layer in the removed portion of the dielectric oxide layer, wherein depositing the amorphous silicon comprises increasing a hydrogen content during deposition of the amorphous silicon layer to simultaneously reduce an extinction coefficient (k) at a wavelength of 633 nm and a refractive index (n) of the amorphous silicon.

12. The method of claim 10, wherein the multilayer patterning stack comprises an organic planarizing layer, a hardmask on the organic planarizing layer, and a photoresist on the hardmask layer.

13. The method of claim 10, wherein the amorphous silicon layer has a thickness within a range from about 5 nanometers to about 10 nanometers.

14. The method of claim 10, wherein depositing the amorphous silicon layer comprises a vapor deposition process from a gas mixture comprising silane and hydrogen gas at a temperature within a range of about 30° C. to about 600° C. and a pressure within a range of about 0.1 Torr to about 10 Torr.

15. The method of claim 14, wherein the hydrogen gas is greater than 10 mol % of the gas mixture and further reduces the extinction coefficient k value to within a range from about 0.09 to about 0.03 and the refractive index value to within a range of about 3.5 to about 3.2.

16. The method of claim 12, wherein the multilayer patterning stack further comprises an adhesion layer, an antireflective layer or a combination thereof.

17. A method for tuning an amorphous silicon layer, the method comprising:

depositing an amorphous silicon layer under a multilayer patterning stack, wherein tuning the amorphous silicon layer comprises increasing hydrogen content in the amorphous silicon to simultaneously provide the amorphous silicon with an extinction coefficient (k) value within a range of about 0.4 to about 0.03 at a wavelength of about 633 nm and a refractive index of the amorphous silicon within a range of from about 4.1 to about 3.2.

18. The method of claim 17, wherein increasing the hydrogen content in the amorphous silicon is in an amount effective to reduce the extinction coefficient (k) value to within a range from about 0.09 to about 0.03 and the refractive index (n) to within about 3.5 to about 3.2.

19. The method of claim 17, wherein depositing the amorphous silicon layer comprises a vapor deposition process selected from the group consisting of chemical vapor deposition, plasma enhanced chemical vapor deposition, and plasma vapor deposition from a silane gas.

20. The method of claim 17, wherein depositing the amorphous silicon layer comprises a vapor deposition process from a gas mixture comprising a silane gas and a hydrogen gas at a temperature within a range of about 30° C. to about 600° C. and a pressure within a range of about 0.1 Torr to about 10 Torr.

* * * * *